(12) United States Patent
Park et al.

(10) Patent No.: US 9,792,992 B1
(45) Date of Patent: Oct. 17, 2017

(54) SEMICONDUCTOR DEVICE AND OPERATING METHOD THEREOF

(71) Applicant: SK hynix Inc., Gyeonggi-do (KR)

(72) Inventors: Byoung Jun Park, Chungcheongbuk-do (KR); Seong Jo Park, Chungcheongnam-do (KR); Kang Jae Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/215,967

(22) Filed: Jul. 21, 2016

(30) Foreign Application Priority Data

Mar. 25, 2016 (KR) .......... 10-2016-0035866

(51) Int. Cl.
*G11C 7/02* (2006.01)
*G11C 16/14* (2006.01)
*G11C 16/04* (2006.01)
*G11C 16/10* (2006.01)

(52) U.S. Cl.
CPC .......... *G11C 16/14* (2013.01); *G11C 16/0466* (2013.01); *G11C 16/10* (2013.01)

(58) Field of Classification Search
CPC .......... G11C 16/107; G11C 16/16; G11C 7/14

USPC ............... 365/210.1, 185.2, 189.011, 189.06
See application file for complete search history.

(56) References Cited

U.S. PATENT DOCUMENTS

| | | | | |
|---|---|---|---|---|
| 2015/0095558 A1* | 4/2015 | Kim | ............... | G06F 12/0246 711/103 |
| 2015/0332772 A1* | 11/2015 | Kim | ............ | G11C 16/32 365/185.22 |
| 2016/0110114 A1* | 4/2016 | Moon | ............ | G06F 12/0246 711/103 |
| 2016/0306590 A1* | 10/2016 | Kang | ............ | G06F 3/0652 |

FOREIGN PATENT DOCUMENTS

| | | |
|---|---|---|
| KR | 100769771 | 10/2007 |
| KR | 1020100106763 | 10/2010 |

* cited by examiner

*Primary Examiner* — Han Yang
(74) *Attorney, Agent, or Firm* — IP & T Group LLP

(57) ABSTRACT

The present disclosure relates to a semiconductor memory device and an operating method thereof. A semiconductor memory device includes a memory cell array including a plurality of memory blocks, a peripheral circuit suitable for performing an erase operation and a program operation to the memory cell array, and a control logic suitable for controlling the peripheral circuit to erase all of the plurality of memory blocks and then to program the plurality of memory blocks with dummy data during the erase operation.

7 Claims, 5 Drawing Sheets

SEMICONDUCTOR DEVICE AND OPERATING METHOD THEREOF

CROSS-REFERENCE TO RELATED APPLICATION

The present application claims priority under 35 U.S.C. §119(a) to Korean patent application number 10-2016-0035866, filed on Mar. 25, 2016, which is incorporated herein by reference in its entirety.

BACKGROUND

Field of Invention

Various embodiments of the invention relate generally to an electronic device and, more particularly, to a semiconductor memory device and an operating method thereof.

Description of Related Art

Semiconductor memory devices may be classified into volatile and non-volatile memory devices.

Non-volatile memory devices operate at relatively lower write and read speeds than volatile memory devices, but they retain their stored data regardless of whether the supply power to the device is turned on or off, Therefore, a non-volatile memory device is employed for storing data which need to be maintained even in the absence of power supply to the device. Examples of non-volatile memory devices include read only memory (ROM), mask ROM (MROM) programmable ROM (PROM), erasable programmable ROM (EPROM), electrically erasable and programmable ROM (EEPROM), flash memory, phase-change random access memory (PRAM), magnetic RAM (MRAM), resistive RAM (RRAM) and ferroelectric RAM (FRAM). Flash memories are used widely and may be classified into NOR- or NAND-type memories.

Flash memories enjoy the advantages of both RAM and ROM devices. For example, flash memories may be freely programmed and erased similar to a RAM. Also, similar to a ROM, flash memories may retain their stored data even when they are not powered. Flash memories have been widely used as the storage media of portable electronic devices such as mobile phones, digital cameras, personal digital assistants (PDAs), and MP3 players.

Flash memory devices may be classified into two-dimensional (2D) semiconductor devices in which a string of memory cells is formed in a horizontal direction to semiconductor device substrate and three-dimensional (3D) semiconductor devices in which a string of memory cells is formed in a vertical direction to a semiconductor device substrate.

SUMMARY

Various embodiments are directed to a semiconductor memory device with improved retention characteristics of program data and an operating method thereof.

According to an embodiment, a semiconductor memory device may include a memory cell array including a plurality of memory blocks; a peripheral circuit suitable for performing an erase operation and a program operation to the memory cell array; and a control logic suitable for controlling the peripheral circuit to erase all of the plurality of memory blocks and then to program the plurality of memory blocks with dummy data during the erase operation.

According to an embodiment, a semiconductor memory device of claim may include a memory cell array including a plurality of memory blocks, a peripheral circuit suitable for performing an erase operation and a program operation to the memory cell array, and a control logic suitable for controlling the peripheral circuit to perform an erase operation and a dummy program operation to all of the plurality of memory blocks in response to an erase command.

According to an embodiment, a method of operating a semiconductor memory device, the method may include providing a semiconductor memory device including a plurality of memory blocks and programming all of the plurality of memory blocks with dummy data.

BRIEF DESCRIPTION OF THE DRAWINGS

Various embodiments of the present invention will now be described in conjunction with the following drawings in which:

FIG. 2 is a block diagram illustrating a memory cell array of FIG. 1, according to an embodiment of the present invent on;

DETAILED DESCRIPTION

Figure 1:
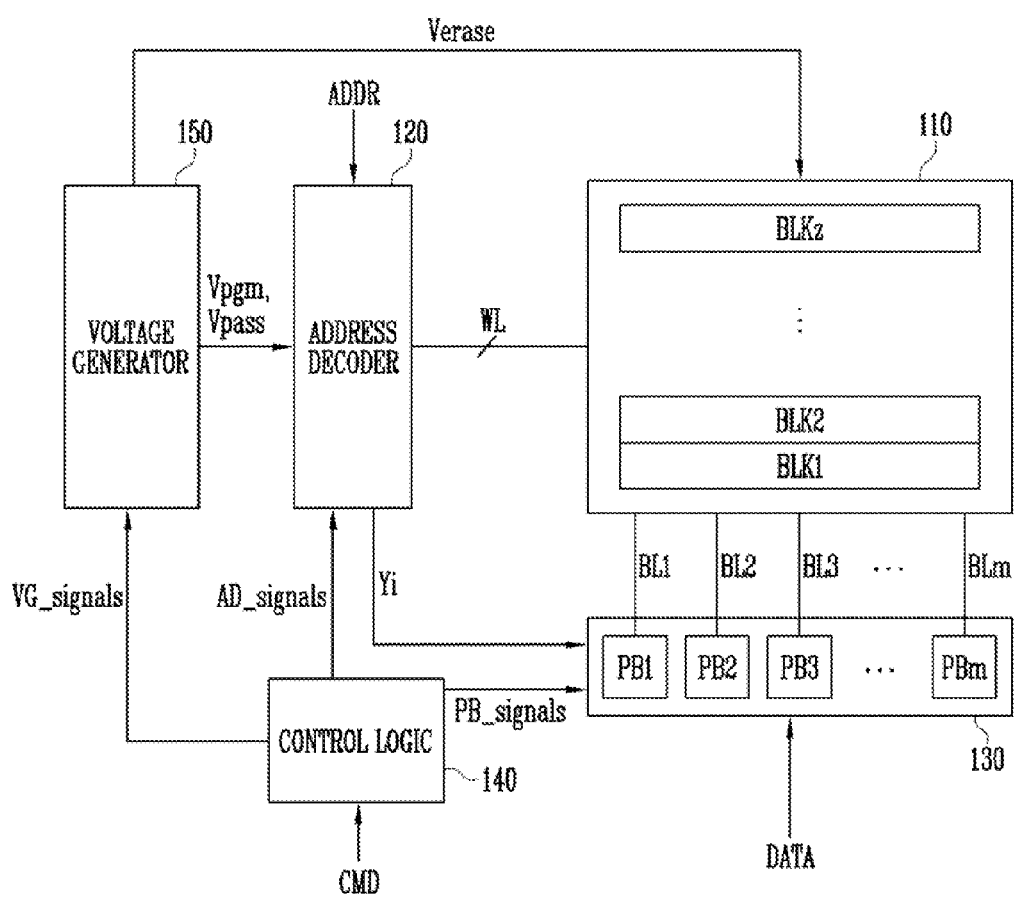
FIG. 1 is a block diagram illustrating a semiconductor memory device, according to an embodiment of the present invention.

Various embodiments of the present invention relate to a semiconductor memory device having improved data retention and reliability and an operating method thereof. It is noted, though that the specific structural and/or functional descriptions of the described embodiments of the present invention are provided for the purpose of illustrating the present invention and are not intended to limit the scope of the invention. Hence, it should be understood that the present invention is not limited to the specific embodiments described herein. Many other embodiments and/or variations thereof that are within the scope of the invention may be envisaged by those skilled in the art to which the present invention pertains after reading the present disclosure.

It should also be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

It will be further understood that, although the terms "first" "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. For example, in the drawings, the thicknesses and the intervals of elements may be exaggerated compared to an actual physical thickness for convenience of illustration.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises" "comprising","includes" and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent those skilled in the relevant art, a feature or element described in connection with one embodiment may be used singly or in combination with other features or elements of another embodiment unless otherwise specifically indicated.

Hereinafter, the various embodiments of the present invention will be described in detail with reference to the attached drawings.

Referring now to FIG. 1 a semiconductor memory device 100 is provided, according to an embodiment of the present invention.

According to the embodiment of FIG. 1, the semiconductor memory device 100 may include a memory cell array 110, an address decoder 120, a read and write circuit 130, a control logic 140, and a voltage generator 150.

The address decoder 120, the read and write circuit 130 and the voltage generator 150 may be defined as a peripheral circuit configured to perform an erase operation and a program operation on the memory cell array 110.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. According to an embodiment, the plurality of memory cells may be non-volatile memory cells. For example, the plurality of memory cells may be non-volatile memory cells based on a charge trap device. A plurality of memory cells connected in common to the same word line may be defined as a single page. The memory cell array 110 may include a plurality of pages. In addition, each of the memory blocks BLK1 to BLKz of the memory cell array 110 may include a plurality of strings. Each of the strings may include a drain selection transistor, a plurality of memory cells and a source selection transistor coupled in series between a bit line and a source line.

The address decoder 120 may be coupled to the memory cell array 110 through the word lines WL. The address decoder 120 may be configured to operate in response to control signals AD_signals output from the control logic 140. The address decoder 120 may receive an address ADDR through an input/output buffer (not illustrated) in the semiconductor memory device 100.

The address decoder 120 may apply the program voltage Vpgm and the pass voltage Vpass generated by the voltage generator 150 to the word lines WL of the memory cell array 110 during a program operation, under the control of the control logic 140.

A program operation of the semiconductor memory device 100 may be performed on at least one selected memory block among the memory blocks BLK1 to BLKz. In addition, a program operation for a selected memory block may be performed in units of pages.

For example, the address ADDR received in response to a request for a program operation may include a block address, a row address and a column address. The address decoder 120 may select one memory block and one word line in response to the block address and the row address. The column address (Yi) may be decoded by the address decoder 120 and provided to the read and write circuit 130.

In addition, an erase operation of the semiconductor memory device 100 may be performed in units of memory blocks. When an erase command is received with respect to a memory block, the memory block may be erased. When an erase command is received with respect to the entirety of the memory blocks then all the memory blocks BLK1 to BLKz may be erased simultaneously or sequentially.

The address ADDR received in response to a request for an erase operation may include a block address. The address decoder 120 may select at least one memory block to be erased in response to the block address. The address decoder 120 may select all the memory blocks to be erased in response to the block address.

The address decoder 120 may include a block decoder, a row decoder, a column decoder and an address buffer.

The read and write circuit: 130 may include a plurality of page buffers PB1 to PBm. The page buffers PB1 to PBm may be coupled to the memory cell array 110 through the bit lines BL1 to BLm. Each of the page buffers PB1 to PBm may temporarily store data DATA received during the program operation and control the potential of each of the bit lines BL1 to BLm on the basis of the temporarily stored data. In addition, the read and write circuit 130 may temporarily store dummy data and control the potential of each of the bit lines BL1 to BLm on the basis of the temporarily stored dummy data when a dummy program operation is performed to program the dummy data after the erase operation.

The read and write circuit 130 may operate in response to control signals PB_signals received from the control logic 140.

The control logic 140 may be coupled to the address decoder 120, the read and write circuit 130, and the voltage generator 150. The control logic 140 may receive a command CMD, for example from a host device (not shown), through an input/output buffer (not illustrated) of the semiconductor memory device 100. The control logic 140 may be configured to control the operations of the semiconductor memory device 100 in response to the command CMD.

When the command CMD for an erase operation of ail memory blocks is received, the control logic 140 may control the address decoder 120, the read and write circuit 130, and the voltage generator 150 to perform the erase operation on al memory blocks BLK1 to BLKz and subsequently program al memory blocks with dummy data.

When a command CMD for a program operation is received, the control logic 140 may control the address decoder 120, the read and write circuit 130, and the voltage generator 150 to perform the erase operation on a selected memory block, among the memory blocks BLK1 to BLKz, and subsequently perform a program operation on the selected memory block.

The voltage generator 150 may operate in response to the control signals VG_signals received from the control logic 140.

The voltage generator 150 may generate an erase voltage Verase in response to a control signal received from the control logic 140 during an erase operation. The erase voltage Verase generated during the erase operation may be provided to a selected at least one memory block, among the memory blocks BLK1 to BLKz, through the source line of the memory cell array 110.

In addition, the voltage generator 150 may generate the program voltage Vpgm and the pass voltage Vpass in response to the control logic 140 during the program operation.

Figure 2:
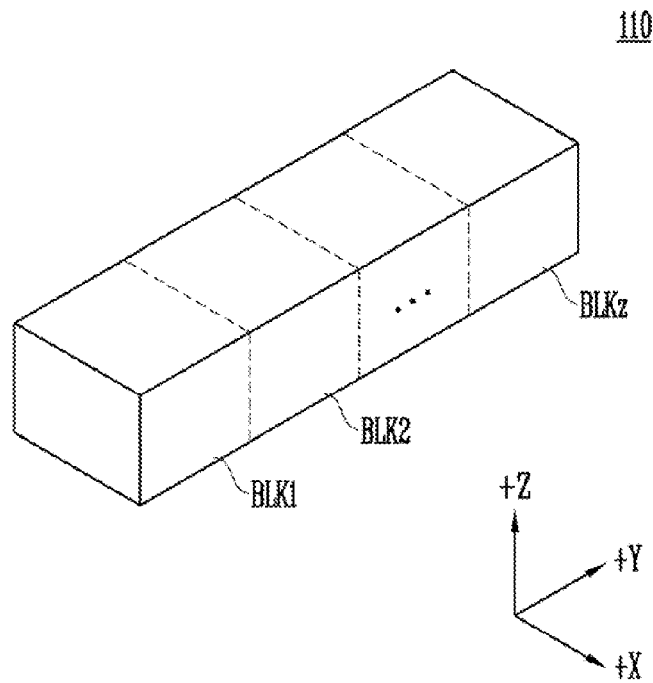

Referring now to FIG. 2 an embodiment of the memory cell array 110 of FIG. 1 is provided.

Referring to FIG. 2, the memory cell array 110 may include the plurality of memory blocks BLK1 to BLKz. Each of the plurality of memory blocks BLK1 to BLKz may have a three-dimensional structure. Each of the memory blocks may include a plurality of memory cells stacked over a substrate. The plurality of memory cells may be arranged in +X direction, +Y direction and +Z direction. Each of the memory blocks BLK1 to BLKz will be described in more detail with reference to FIGS. 3 and 4.

Figure 3:
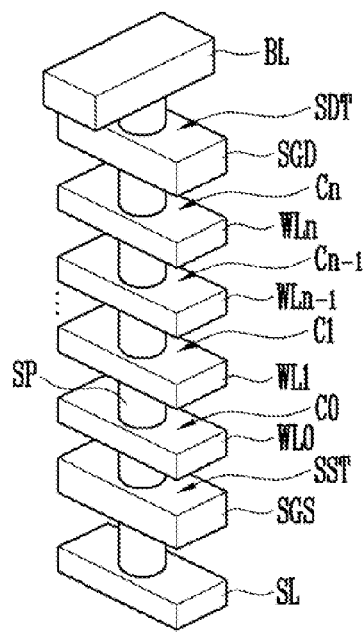
FIG. 3 is a three-dimensional view illustrating a memory string included in a memory block, according to an embodiment of the present invention.
Figure 4:
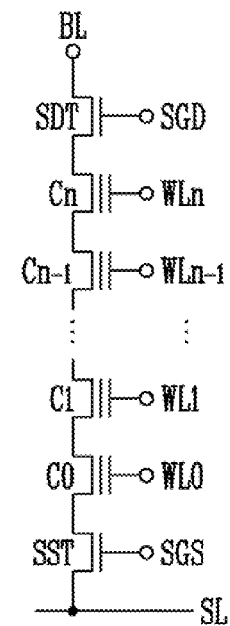
FIG. 4 is a circuit diagram of the memory string of FIG. 3.

FIG. 3 is a three-dimensional view illustrating a memory string included in a memory block according to an embodiment of the present invention. FIG. 4 is a circuit diagram of the memory string of FIG. 3.

Referring to FIGS. 3 and 4, a source line SL may be formed over a semiconductor substrate. A vertical channel layer SP may be formed on the source line SL. A top portion of the vertical channel layer SP may be coupled to a bit line BL. The vertical channel layer SP may include, for example, polysilicon. A plurality of conductive layers SGS, WL0 to WLn, and SGD may be formed to surround the vertical channel layer SP at different heights. The plurality of conductive layers SGS, WL0 to WLn, may be spaced apart along the +Z direction at regular intervals. The interspace between two successive conductive layers may include an insulating layer (not illustrated). A multilayer film (not illustrated)including a charge storage layer may be formed on the surface of the vertical channel layer SP. The multilayer film may be located between the vertical channel layer SP and the conductive layers SGS, WL0 to WLn, and SGD. The multilayer film may have an ONO structure in which an oxide layer, a nitride layer and an oxide layer are sequentially stacked.

The lowermost conductive layer may be a source selection line (or first selection line) SGS, and the uppermost conductive layer may be a drain selection line (or second selection line) SGD. A plurality of conductive layers between the selection lines SGS and SGD may be word lines WL0 to WLn. In other words, the conductive layers SGS, WL0 to WLn and SGD may be formed of a plurality of layers over the semiconductor substrate. The vertical channel layer SP passing through the conductive layers SGS, WL0 to WLn, and SGD may be coupled in a vertical direction between the bit line BL and the source line SL formed on the semiconductor substrate.

A drain selection transistor SDT may be formed at a portion where the uppermost conductive layer SGD surrounds the vertical channel layer SP. A source selection transistor SST may be formed t a portion where the lowermost conductive layer SGS surrounds the vertical channel layer SP. Memory cells C0 to Cn may be formed at portions where intermediate conductive layers WL0 to WLn surround the vertical channel layer SP.

The memory string having the above-described structure may include the source selection transistor SST, the memory cells C0 to Cn and the drain selection transistor SDT coupled in the vertical direction to the substrate between the source line SL and the bit line BL. The source selection transistor SST may electrically couple the memory cells C0 to Cn to the source line SL in response to a first selection signal applied to the first selection line SGS. The drain selection transistor SST may electrically couple the memory cells C0 to Cn to the bit line BL in response to a second selection signal applied to the second selection line SGD.

Figure 5:
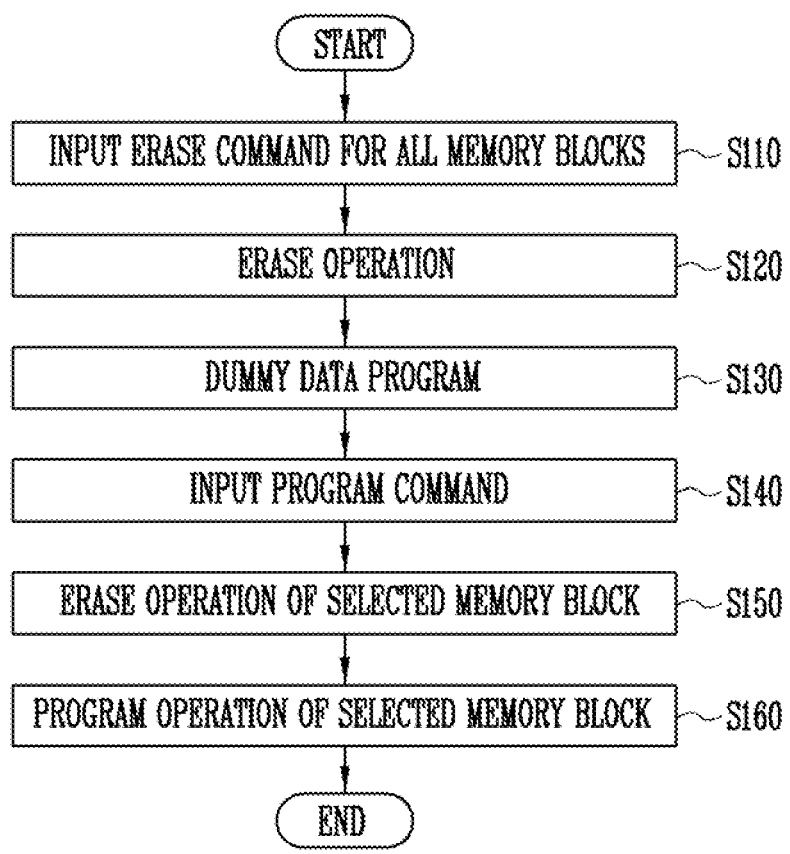
FIG. 5 is a flowchart illustrating operations of a semiconductor memory device, according to an embodiment of the present invention.

FIG. 5 is flowchart illustrating operations of semiconductor memory device according to an embodiment of the present invention.

A method of operating a semiconductor memory device, according to an embodiment will be described below with reference to FIGS. 1 to 5.

When a command CMD for an erase operation to the entirety of the memory blocks is input at step S110, the control logic 140 may control the address decoder 120, the read and write circuit 130, and the voltage generator 150 to perform the erase operation on the entirety of the memory blocks at step S120.

The erase operation may be performed to al memory blocks BLK1 to BLKz simultaneously or sequentially.

The voltage generator 150 may apply the erase voltage Verase to the source line SL of the memory cell array 110 in response to control of the control logic 140.

When all memory blocks are erased at the same time, the address decoder 120 may apply an erase operation voltage generated by the voltage generator 150 to the word lines WL of the memory blocks BLK1 to BLKz.

When the memory blocks BLK1 to BLKz are sequentially erased, the control logic 140 may control the address decoder 120 to select the first memory block (e.g. the first memory block BLK1) and apply the erase operation voltage generated by the voltage generator 150 to the selected first memory block BLK1. The erase voltage Verase generated by the voltage generator 150 may be applied to the source line SL of the selected first memory block BLK1. After the erase operation to the first memory block BLK1 is completed, the control logic 140 may control the address decoder 120 to perform the erase operation to a subsequent memory block (e.g., the second memory block BLK2). The subsequent memory block may be selected by increasing a block address by 1 (one) each time. The control logic 140 may control the address decoder 120 and the voltage generator 150 to perform the erase operation by sequentially selecting the memory blocks until the erase operation to the last memory block BLKz is completed.

When the erase operation to all of the memory blocks BLK1 to BLKz is completed, a dummy program operation may be performed by programming each of the memory blocks BLK1 to BLKz with dummy data at step S130.

The read and write circuit 130 may temporarily store the dummy data and control the potential of each of the bit lines BL1 to BLm according to the temporarily stored dummy data in response to control of the control logic 140.

In response to control of the control logic 140, the voltage generator 150 may generate the program voltage Vpgm and the pass voltage Vpass and the address decoder 120 may apply the program voltage Vpgm and the pass voltage Vpass to word lines of a selected one among the plurality of memory blocks BLK1 to BLKz, thereby performing the dummy program operation.

The dummy data may be random data. For example, the dummy data may be random data generated using any suitable well known technique.

The above-described dummy program operation program dummy data may be performed to each of the memory blocks BLK1 to BLKz.

When the command CMD for a program operation is input at step S140, the control logic 140 may control the address decoder 120 and the voltage generator 150 to perform the erase operation to a selected memory block, to which a program operation is to be performed, at step S150.

The address decoder 120 may select the memory block, to which the program operation is to be performed, and apply the erase operation voltage generated by the voltage generator 150 to the word lines WL of the selected memory block. The voltage generator 150 may then perform the erase operation by applying the erase voltage Verase to the source line SL of the selected memory block in response to control of the control logic 140.

Subsequently, the program operation may be performed to the selected memory block at step S160.

Each of the page buffers PB1 to PBm of the read and write circuit 130 may temporarily store the data DATA to be programmed, and control the potential of each of the bit lines BL1 to BLm corresponding thereto according to the temporarily stored data DATA. The data DATA may be input together with the command CMD for the program operation. Under the control of the control logic 140, the voltage generator 150 may generate the program voltage Vpgm and the pass voltage Vpass and the address decoder 120 may apply the program voltage Vpgm and the pass voltage Vpass to word lines of a selected one among the memory blocks BLK1 to BLKz, thereby performing the program operation.

As described above, according to an embodiment, when an erase command for an entirety of memory blocks is input, all memory blocks may be erased and then dummy data may be programmed. Subsequently, when a program command for a selected memory block is input, an erase operation may be performed to the selected memory block, and then a program operation may then be performed. As a result, program data may be stored in the selected memory block and the remaining memory blocks may be programmed with, the dummy data. This way, the program data which are stored in a programmed memory block are not subjected to interference by adjacent memory blocks in an erase state, and hence, the retention characteristics of the program data may be improved.

According to another embodiment, when a command CMD for the erase operation to all memory blocks is input at step S110 an erase operation of step S120 to all memory blocks and program operation of step S130 to the dummy data may be skipped and instead a dummy program pulse may be applied to all the memory blocks, thereby performing a dummy program operation. Subsequently, as illustrated in FIG. 5, steps S140 to S160 may be sequentially performed. This embodiment, may be advantageous, because even when a command CMD for an erase operation to all the memory blocks is input, the erase operation to all memory blocks may be skipped, so that the entire operation time and power consumption may be reduced.

Figure 6:
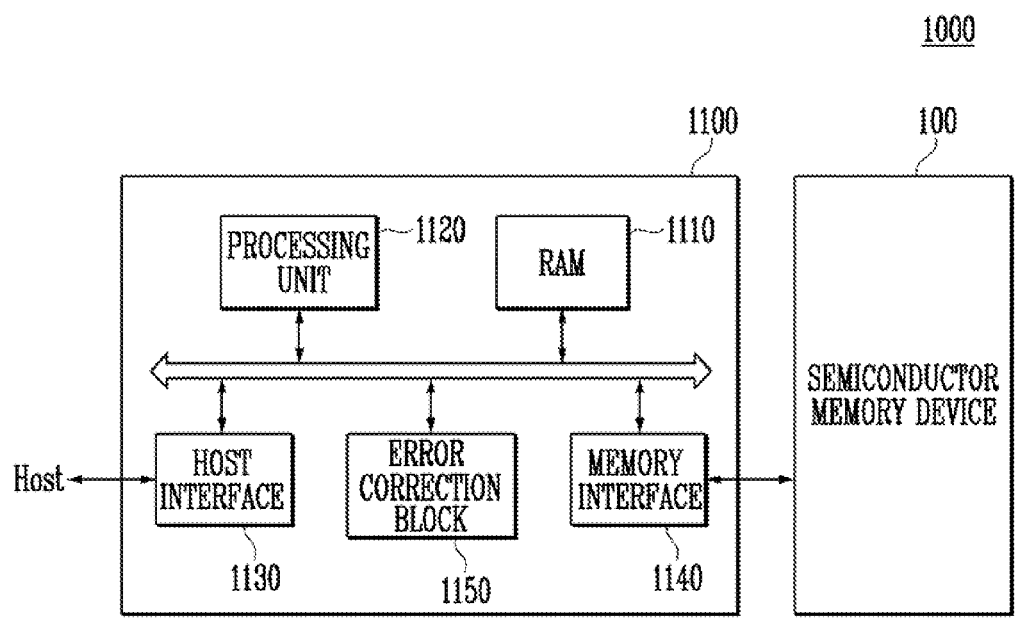
FIG. 6 is a block diagram illustrating a memory system including a semiconductor memory device, according to an embodiment of the present invention.

FIG. 6 illustrates a memory system 1000 including a semiconductor memory device, according to an embodiment of the present invention.

The semiconductor memory device 100 may be the same as the semiconductor memory device described above with reference to FIG. 1. Thus, a detailed description thereof will be omitted.

A controller 1100 may be coupled to a host and the semiconductor memory device 100. The controller 1100 may be configured to access the semiconductor memory device 100 at the request of the host. For example, the controller 1100 may control at least one of a read operation, a program operation, an erase operation, and/or a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as operation memory of the processing unit 1120, cache memory between the semiconductor memory device 100 and the host, and/or a buffer memory between the semiconductor memory device 100 and the host. The processing unit 1120 may control operations of the controller 1100. In addition, the controller 1100 may temporarily store program data provided form the host during a write operation.

The host interface 1130 may include a protocol for exchanging data between the host and the controller 1100. For example, the controller 1100 may communicate with the host through one or more various protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol a small computer small interface (SCSI) protocol, an enhanced small disk interface (ESDI) protocol, an integrated drive electronics (IDE) protocol, a private protocol, and the like.

The memory interface 1140 may interface the controller with the semiconductor memory device 100. Any suitable interface may be employed. For example, in an embodiment, the memory interface may include a NAND flash interface or a NOR flash interface., The error correction block 1150 may detect and correct errors in data read from the semiconductor memory device 100 by using an error correction code (ECC). Any suitable error correction block may be employed. The processing unit 1120 may control a read voltage based on an error detection result of the error correction block 1150 and perform are-read operation. According to an embodiment, the error correction block may be provided as a component of the controller 1100.

The controller 1100 and the semiconductor memory device 100 may be integrated in a single semiconductor device. According to an embodiment, the controller 1100 and the semiconductor memory device 100 may be integrated in a single semiconductor device to form a memory card, such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), and the like.

The controller 1100 and the semiconductor memory device 100 may be integrated in a single semiconductor device to form a solid state drive (SSD). The SSD may include a storage device for storing, data in a semiconductor memory device. When the memory system 1000 is used as an SSD, operational rates of the host coupled to the memory system 1000 may be significantly improved.

In another example, the memory system 1000 may be used as one of several elements in various electronic devices, such as a computer, an ultra mobile PC (UMPC), a workstation, a net-book, a personal digital assistant (PDA), a portable con putter, a web table, a wireless phone, a mobile phone, a smart phone, an e-book, a portable multimedia player (PMP), a portable game machine, a navigation device, a black box, digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, and the like.

According to an exemplary embodiment, the semiconductor memory device 100 or the memory system 1000 may be packaged in various forms. For example, the semiconductor memory device 100 or the memory system 1000 may be packaged by various methods, such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), plastic metric quad flat package (MQFP), a thin quad flat package (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), and the like.

Figure 7:
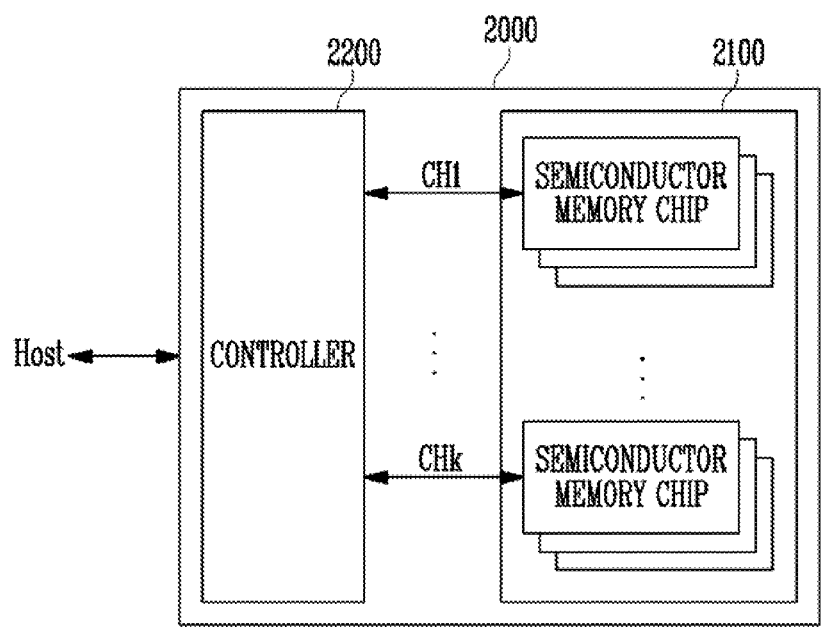
FIG. 7 is a block diagram illustrating a memory system, according to an embodiment of the present invention.

Referring to FIG. 7, a memory system 2000 may include a semiconductor memory device 2100 and a controller 2200. The semiconductor memory device 2100 may include a plurality of semiconductor memory chips. The plurality of semiconductor memory chips may be divided into groups FIG. 7 illustrates the plurality of groups communicating with the controller 2200 through first to k-th channels CH1 to CHk. Each of the semiconductor memory chips may be configured and operated in substantially the same manner as one of the semiconductor memory devices 100 described above with reference to FIG. 1.

Each group may communicate with the controller 2200 through a single common channel. The controller 2200 may be configured in substantially the same manner as the controller 1100 described with reference to FIG. 6, and configured to control the plurality of memory chips of the semiconductor memory device 2100 through the plurality of first to k-th channels CH1 to CHk.

Figure 8:
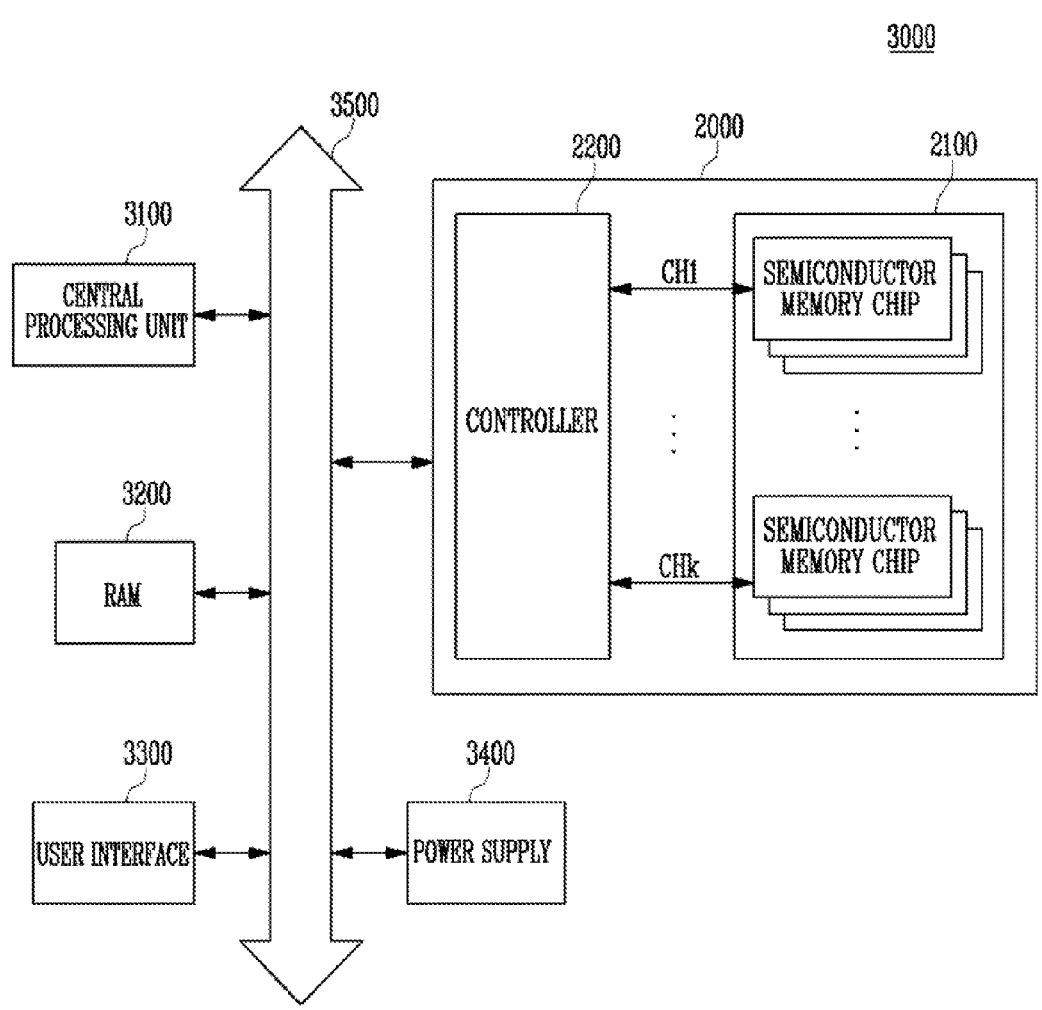
FIG. 8 is a block diagram illustrating a computing system including a memory system, according to an embodiment of the present invention.

FIG. 8 illustrates a computing system 3000 including a memory system according to the embodiment of FIG. 7.

Referring to FIG. 8, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided trough the user interface 3300 or processed by the central processing unit 3100 may be stored in the memory system 2000.

As illustrated in FIG. 8, the semiconductor memory device 2100 may be coupled to the system bus 3500 through the controller 2200. However, the semiconductor memory device 2100 may be directly coupled to the system bus 3500. The central processing unit 3100 and the RAM 3200 may perform the functions of the controller 2200.

As illustrated in FIG. 8, the memory system 2000 of FIG. 7 may be provided. However, the memory system 2000 may be replaced with the memory system 1000 described above with reference to FIG. 6. According to an embodiment, the computing system 3000 may include both of the memory systems 1000 and 2000 described above with reference to FIGS. 6 and 7, respectively.

According to the aforementioned embodiments, a retention characteristic for data programmed during a program operation of a semiconductor memory device may be improved.

It will be apparent to those skilled in the art that various modifications can be made to the above-described exemplary embodiments of the present invention without departing from the spirit or scope of the invention as defined by the appended claims.

What is claimed is:

1. A semiconductor memory device, the semiconductor memory device comprising:
   a memory cell array including a plurality of memory blocks;
   a peripheral circuit suitable for performing an erase operation and a program operation to the memory cell array; and
   a control logic suitable for controlling the peripheral circuit to erase all of the plurality of memory blocks and then to program the plurality of memory blocks with dummy data during the erase operation in response to an erase command corresponding to the erase operation of all of the plurality of memory blocks, and to erase the dummy data programmed into a selected memory block, among the plurality of memory blocks programmed with the dummy data, and program the selected memory block in response to a program command during the program operation after the erase operation.

2. The semiconductor memory device of claim 1, wherein the control logic controls the peripheral circuit to erase all of the plurality of memory blocks simultaneously or sequentially during the erase operation.

3. The semiconductor memory device of claim 1, wherein the dummy data is random data.

4. A method of operating a semiconductor memory device, the method comprising:
   providing a semiconductor memory device including a plurality of memory blocks;
   erasing all of the plurality of memory blocks in response to an erase command for the erase operation of all of the plurality of memory blocks;
   programming all of the plurality of memory blocks with dummy data;
   perfoming a block erase operation on a selected memory block programmed with the dummy data among the plurality of memory blocks in response to a program command; and
   performing a program operation with the program data to the selected memory block.

5. The method of claim 4, wherein the program data is input along with the program command.

6. The method of claim 4, wherein the erasing of all of the plurality of memory blocks comprises erasing the plurality of memory blocks simultaneously or sequentially.

7. The method of claim 4, wherein the dummy data is random data.

\* \* \* \* \*